United States Patent [19]

Billi et al.

[11] 4,352,182

[45] Sep. 28, 1982

[54] METHOD OF AND DEVICE FOR TESTING THE QUALITY OF DIGITAL SPEECH-TRANSMISSION EQUIPMENT

[75] Inventors: Roberto Billi, Leghorn; Carlo Scagliola, Genoa, both of Italy

[73] Assignee: Cselt - Centro Studi e Laboratori Telecomunicazioni S.p.A., Turin, Italy

[21] Appl. No.: 215,796

[22] Filed: Dec. 12, 1980

[30] Foreign Application Priority Data

Dec. 14, 1979 [IT] Italy .............................. 69404 A/79

[51] Int. Cl.³ ............................................. G01R 27/00
[52] U.S. Cl. ................................... 371/22; 179/1 SA; 375/10
[58] Field of Search ............................. 371/22; 364/724; 375/10; 179/175.2 R, 175.3 R, 1 SA; 324/73 R; 178/69 A

[56] References Cited

U.S. PATENT DOCUMENTS 3,842,247 10/1974 Anderson ............................... 375/10
3,875,500 4/1975 Fletcher et al. ........................ 375/10
4,191,653 3/1980 Piesinger ............................. 179/1 SA
4,227,160 10/1980 Tamori et al. ........................ 364/724

OTHER PUBLICATIONS

C. Scagliola, Evaluation of Adaptive Speech Coders Under Noisy Channel Conditions, The Bell System Technical Journal, vol. 58, Jul.-Aug. 1979, No. 6 Pt. 2, pp. 1369-1394.
Modena et al., A Mathematical Model of an Artificial Signal for the Testing of Digital Speech Transmission Systems, CSELT Rapporti Tecnici, vol. VI, N. 1, Mar. 1978, pp. 47-54.
McDermott et al., Perceptual and Objective Evaluation of Speech Processed by Adaptive Differential PCM, The Bell System Technical Journal, vol. 57, No. 5, May-Jun. 1978, pp. 1597-1617.

Primary Examiner—Charles E. Atkinson
Attorney, Agent, or Firm—Karl F. Ross

[57] ABSTRACT

A device for analyzing the quality of digital speech-transmission equipment, specifically a speech coder, comprises generators of white-noise signals, sinusoidal signals, frequency-shaped signals and artificial speech-like signals connected to the coder and to an adaptive transversal filter in parallel therewith. The filter and the coder feed output signals to a subtractor which produces an error or noise signal by deducting digital samples of the filter output signal from corresponding samples of the coder output signal. The error signal is fed back to the filter during a first testing phase to control the periodic modification of weighting coefficients computed by a multiplicity of updating cells in the filter for multiplicative combination with incoming samples of the test signal. The first phase ends when the coefficients converge to fixed values representative of the linear characteristics of the coder and the error signal assumes a substantially constant near-zero level. In a second testing phase the error signal from the subtractor and the corrected output signal of the filter are fed to a quality analyzer which calculates one or more parameters from a set comprising a total signal-to-noise ratio, a simple segmental signal-to-noise ratio and a frequency-weighted segmental signal-to-noise ratio, the parameters being linearly combined to produce an integer between zero and ten indicative of the transmission quality of the coder.

13 Claims, 7 Drawing Figures

METHOD OF AND DEVICE FOR TESTING THE QUALITY OF DIGITAL SPEECH-TRANSMISSION EQUIPMENT

FIELD OF THE INVENTION

Our present invention relates to a method of and a device for testing or measuring the quality of digital speech-transmission equipment, in particular speech coders.

BACKGROUND OF THE INVENTION

In the testing of digital speech-transmission equipment, objective and automatic measurement techniques are ever more preferred to subjective techniques requiring the utilization of human listeners, this preference being chiefly due to the greater speed and decreased costs. The disadvantage of using electronic measurement techniques is that human listeners are generally more accurate in pinpointing the quality of the systems tested.

In automatic techniques a suitable test signal is fed to the speech-transmission system and a resulting output signal is compared instant by instant with the input signal. The crucial problems are those concerning the choice of the input signal and of the quantities or characteristics to be analyzed. Sinusoidal input signals have yielded satisfactory results in the testing of pulse-code-modulation (PCM) systems; however, in systems having a lower rate of bit transmission, such as those of the differential type, it is preferable to use a signal resembling speech signals as much as possible, e.g. having spectral characteristics similar to those of the average voice.

Signal-to-noise ratios, e.g. the ratio of the power of the input signal to the power of an error signal such as the difference between the output and input signals, have proven to be good indication of system quality for PCM devices. In the case of differential systems two other quantities have provided better results: (1) the segmental signal-to-noise ratio, i.e. an average of the signal-to-noise ratios for a predetermined number of intervals into which the test period is divided, and (2) a frequency-weighted segmental signal-to-noise ratio in which the signal spectrum is divided into a multiplicity of frequency bands and signal-to-noise ratios are computed for each band, the segmental ratio being a weighted mean of the calculated values. The latter measure is particularly useful in testing low-bit-rate coders which exhibit a spectral shaping of quantization noise.

It has been found that the various quality-measuring procedures require particular input signals to achieve optimal results. Thus, for example, frequency weighting is incompatible with input signals having stationary or uniform characteristics corresponding to those of average-speech signals. Optimal results in the use of frequency weighting are obtained from utilizing actual human-speech segments or of preshaped noise segments; however, a plurality of voiced-speech signals must be used and the results averaged to obtain reliable outcomes.

Speech-transmission equipment introduces attenuations (or gains), linear filtering, delays, etc. which do not affect the signal quality but do affect the objective measurement of that quality. This is one reason for not using the input test signal in the computation of transmission characteristics.

Another factor frequently introducing error into objective quality measurements is the necessity of maintaining perfect synchronization between the input and output signals of the speech-transmission equipment.

At the present state of the art, components of speech-transmission systems are generally studied through computer-implemented simulation. Errors arise because a mathematical model of the system is being tested rather than the component itself. The characteristics of the transmission equipment under test are rarely known to the extent that they can be accurately quantified in a model.

OBJECTS OF THE INVENTION

An object of our present invention is to provide an improved method of and a device for measuring the quality of digital speech-transmission equipment, which eliminates the effects on the testing results of linear operating parameters that do not influence the quality of transmission.

Another object of our invention is to provide means in such a device facilitating the use of a variety of quality measurements with different input signals.

A further object of this invention is to eliminate the need for a detailed knowledge of actual characteristics of the equipment under test.

SUMMARY OF THE INVENTION

In testing the quality of digital speech-transmission equipment, e.g. a speech coder, our invention provides for generating a first test signal consisting of a sequence of digital samples and transmitting this test signal to the subject equipment and to an adaptive transversal filter. The samples of the test signal are modified in the filter by multiplication with weighting coefficients to produce a first corrected signal which is subsequently subtracted from a first output signal of the transmission equipment to generate a first error signal. This error signal is fed back to the filter for at least partially controlling the updating of the weighting coefficients. Upon minimization of the error signal, the current values of the coefficients are stored, these values identifying the characteristics of the linear part of the equipment.

A second test signal consisting of a sequence of digital samples, possibly identical with those of the first test signal, is then generated and fed to the speech-transmission equipment and to the filter. In the filter the samples of the second test signal are weighted with the stored values of the coefficients to form a second corrected signal. A second error signal is produced as a difference between the second corrected signal and a second output signal emitted by the equipment in response to the second test signal. An indication of transmission quality is calculated from the second error signal and the second corrected signal.

According to another feature of our present invention, the filter updates the weighting coefficients according to the relationship:

$$C_k^{n+1} = C_k^n + \frac{2\alpha}{\sum_{i=1}^{M} r_{n-i}^2} \cdot e_n \cdot r_{n-k} \quad (I)$$

where $C_k^n$ and $C_k^{n+1}$ are the values of the $k^{th}$ weighting coefficient at instants $nT$ and $(n+1)T$, respectively, $T$ being the period of the samples in the first test signal;

$r_{n-i}$, $r_{n-k}$ are samples of the first test signal at instants $(n-i)T$ and $(n-k)T$; $\alpha$ is an adaptation constant having a value between zero and one and determining in part the convergence rate of coefficients $C_k$ ($k = 1, 2, \ldots M$); and $e_n$ is the value of the first error signal at instant $nT$.

Advantageously, the step of calculating a quality indication of the transmission system involves a computation of one or more of the following parameters: a total signal-to-noise ratio, a simple segmental signal-to-noise ratio and a frequency-weighted segmental signal-to-noise ratio. Each of these parameters includes a plurality of fractions whose numerators are functions of the second corrected signal and whose denominators are functions of the second error signal. Preferably, a plurality of these parameters calculated from signal-to-noise ratios are linearly combined to form an indication of the quality of transmission.

As test signals we may use sinusoidal signals, white-noise signals, frequency-shaped noise signals, actual speech signals and/or periodic artificial speech signals.

A device for testing the quality of digital speech-transmission equipment comprises, according to our present invention, a signal source or generator connected to that equipment for feeding thereto during a first operating phase a first test signal giving rise to a first output signal and for feeding to the equipment during a second operating phase a second test signal giving rise to a second output signal, the test signals and the output signals consisting of sequences of digital samples. A signal transformer or converter in the form of an adaptive transversal filter is connected to the signal source in parallel with the transmission equipment for producing a first and a second corrected signal in response to the first and the second test signal, respectively. The filter is provided with multipliers for weighting samples in the test signals with coefficients periodically modified during the first operating phase to assume, prior to the second operating phase, fixed values identifying and codifying linear characteristics of the equipment under test. A subtractor is connected to the transmission equipment and to the filter for deducting from each sample of the first output signal a corresponding sample of the first corrected signal to produce a first error signal which is transmitted to the filter during the first operating phase for controlling the modification of the weighting coefficients. A calculating circuit is connected to the subtractor and to the filter for computing during the second operating phase an indication of the quality of transmission from the second corrected signal and a second error signal formed by the subtractor as a difference between samples of the second output signal and corresponding samples of the second corrected signal.

A generator of periodic artificial signals having the spectral characteristics of average speech, which may be used as a signal source for our testing device, advantageously includes a first unit producing a high-frequency periodic signal, a second unit producing a slowly varying envelope signal and a multiplier for forming the product of the two signals.

The calculating circuit of our device may include a plurality of computing networks for measuring the transmission quality of the equipment under test according to different computational algorithms, an adder being advantageously provided at the outputs of the networks for linearly combining the measured values. Alternatively, the calculating circuit may comprise a programmable unit with a memory storing instructions for calculating a variety of measuring values to be linearly combined.

BRIEF DESCRIPTION OF THE DRAWING

These and other features of our present invention will now be described in detail, reference being made to the accompanying drawing in which.

SPECIFIC DESCRIPTION

Figure 1:
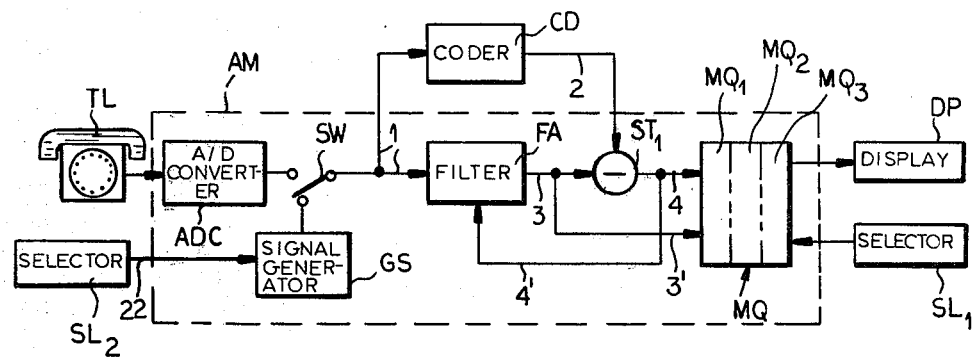
FIG. 1 is a block diagram of a testing device according to our present invention, showing a filter connected in parallel with a speech coder between a signal source and a quality analyzer.

As illustrated in FIG. 1, a device AM for measuring or testing the quality of a component CD for digital speech transmission—specifically a speech coder—comprises, according to our present invention, a signal source GS connected via a switch SW and a lead 1 to coder CD and to an adaptive transversal filter FA in parallel therewith. Coder CD and filter FA have respective output leads 2 and 3 working into a subtractor $ST_1$ whose output lead 4 extends to a quality analyzer MQ and has a branch 4' forming a feedback loop to filter FA. Analyzer MQ, also receiving the output signals of filter FA via a branch 3' of lead 3, has an output tied to a display unit DP and an input connected to a selector $SL_1$.

Figure 6:
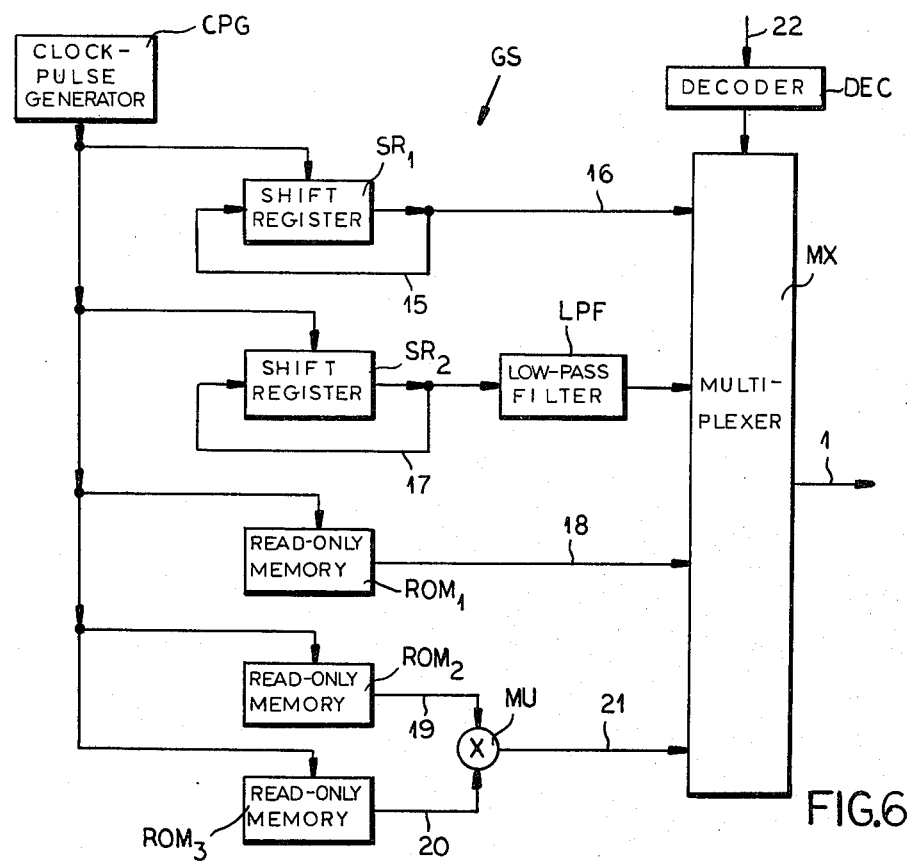
FIG. 6 is a block diagram of a signal generator shown in FIG. 1.

As illustrated in FIG. 6, source GS includes a white-noise generator in the form of a shift register $SR_1$ provided with a feedback loop 15 and connected via an output lead 16 to a multiplexer MX; loop 15 is controlled by a nonillustrated programmer to generate a pseudorandom signal on lead 16. A second shift register $SR_2$ with a feedback loop 17 works into a low-pass filter LPF connected to another input of multiplexer MX, shift register $SR_2$ and filter LPF together functioning as a generator of frequency-shaped noise. Source GS further includes a first read-only memory $ROM_1$ emitting digitally encoded sinusoidal signals to multiplexer MX via a lead 18. A second and a third read-only memory $ROM_2$, $ROM_3$ have respective output leads 19, 20 extending to a multiplier MU which transmits to multiplexer MX via a lead 21 a digital signal representing the product of the signals read out from memories $ROM_2$, $ROM_3$ via leads 19, 20. Memory $ROM_2$ stores samples of a periodic signal generated as described by G. Modena, S. Sandri and C. Scagliola in a paper titled "A Mathematical Model of an Artificial Signal for the Testing of Digital Speech-Transmission Systems," CSELT Technical Reports, Vol. VI, No. 1, March 1978, while memory $ROM_3$ stores samples of a slowly varying envelope signal. The product emitted by multiplier MU represents a periodic artificial speech signal which is particularly advantageous in studying the effects of speech coder CD on incoming voice signals.

As further shown in FIG. 6, a clock-pulse generator CPG is connected to enabling or reading inputs of shift registers SR$_1$, SR$_2$ and memories ROM$_1$-ROM$_3$ for inducing same to emit to multiplexer MX sequences of digital pulses representing successive levels of noise or speech-like signals. A selector SL$_2$ (FIG. 1) is tied via a lead 22 and a decoder DEC (FIG. 6) to multiplexer MX for controlling the switching functions thereof, whereby a signal carried by one of leads 16, 18, 21 or emitted by filter LPF is selected by an operator for transmission via multiplexer MX and lead 1 to coder CD and filter FA (FIG. 1).

Source GS may alternatively comprise a set of analog-signal generators (not shown) whose access to lead 1 is operator-controlled via selector unit SL$_2$. As illustrated in FIG. 1, an external signal source such as a microphone, tape recorder or telephone set TL may be connected to switch SW via an analog/digital converter ADC for supplying actual speech signals to coder CD and filter FA for use in the testing process. If component GS is an analog source, converter ADC will have to be disposed downstream of switch SW.

During a first phase of a testing process, source GS emits to coder CD and filter FA a test signal, preferably a white-noise signal from register SR$_1$, comprising a sequence of digital samples (n=0, 1, 2 . . .). Filter FA multiplies the samples by weighting coefficients C$_k$ (k=0, 1 . . . M) which are periodically modified during the first testing phase to assume, prior to a second testing phase, fixed values which together reflect linear characteristics of coder CD.

Figure 2:
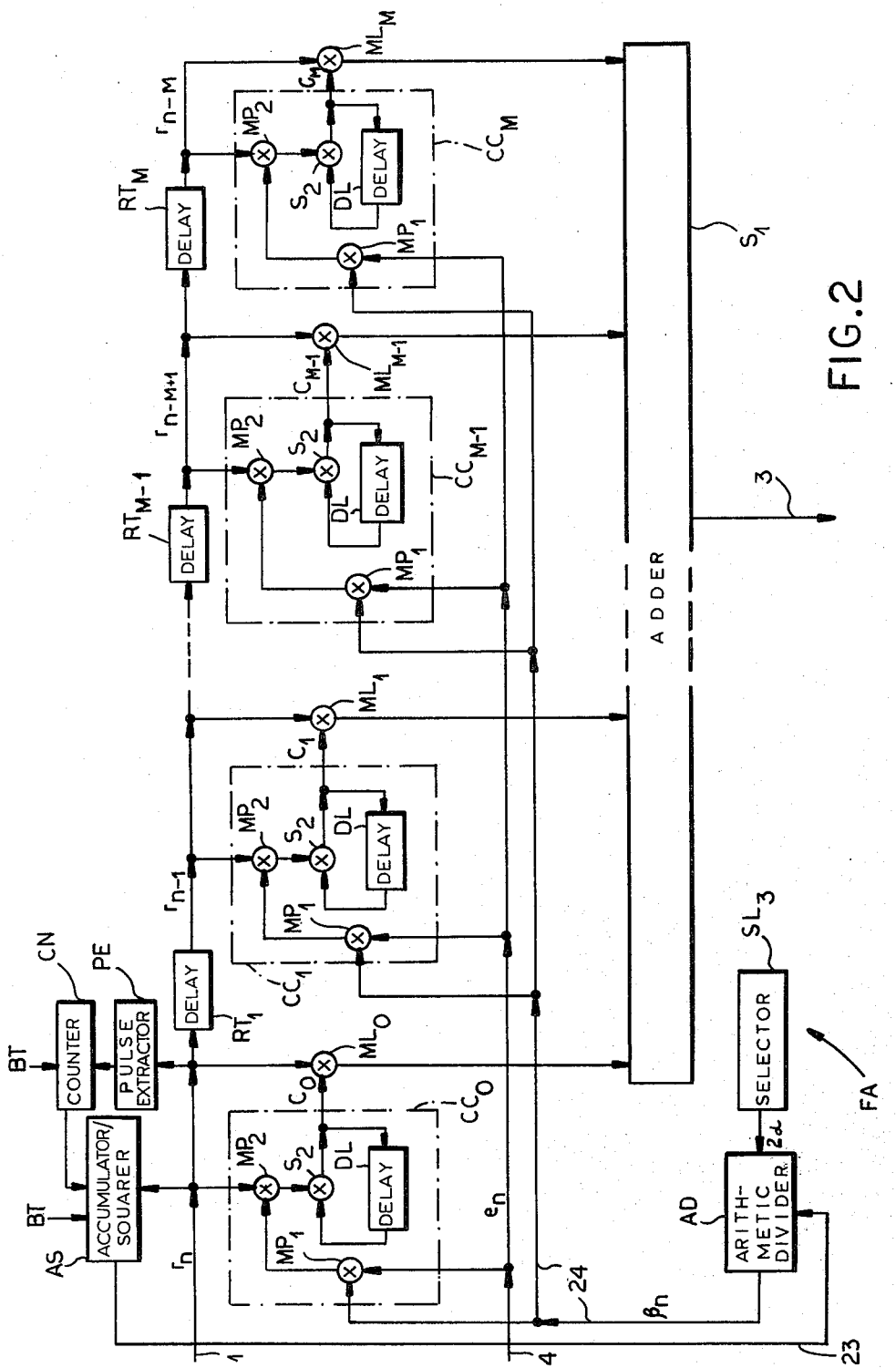
FIG. 2 is a block diagram of the filter of FIG. 1.

As illustrated in FIG. 2, filter FA includes M+1 coefficient-processing or updating circuits CC$_0$, CC$_1$ . . . CC$_{M-1}$, CC$_M$ each having a first multiplier MP$_1$ connected at an input to lead 4' (see FIG. 1) and at an output to a second multiplier MP$_2$. This multiplier has an output lead extending to an adder S$_2$ whose output signals are fed back via a delay line DL to an input thereof. The adder S$_2$ of the first updating circuit CC$_0$ is connected at its output to a multiplier ML$_0$ which receives the incoming digital samples r$_n$ directly from lead 1.

Let us assume that the test signals arriving from source GS over lead 1 have an intersample period T. Lead 1 is in cascade with a series of delay lines RT$_1$ . . . RT$_{M-1}$, RT$_M$ which retard incoming signals by a time equal to the intersample period T. Thus, at time nT samples r$_{n-1}$, r$_{n-M+1}$, r$_{n-M}$ are present at the outputs of delay lines RT$_1$ . . . RT$_{M-1}$, RT$_M$, respectively, these signals being transmitted to multipliers MP$_2$ of circuits CC$_1$ . . . C$_{M-1}$, CC$_M$ and to multipliers ML$_1$ . . . ML$_{M-1}$, ML$_M$. The adder S$_2$ of each circuit CC$_1$-CC$_M$ is connected at its output to a respective multiplier ML$_1$-ML$_M$, multipliers ML$_0$, ML$_1$-ML$_M$ having respective output leads extending to a multiple-input adder S$_1$ with a single output terminal connected to lead 3 (see FIG. 1).

Lead 1 is linked both directly and indirectly, via pulse extractor PE and a counter CN, to an accumulator-squarer AS which has an output lead 23 extending to an arithmetic divider AD. This divider receives from a selector SL$_3$ signals coding the value of a convergence constant α determining the speed at which coefficients C$_k$ approach their final or fixed values during the first testing phase. Divider AD is connected via a lead 24 to inputs of the first multipliers MP$_1$ of coefficient-processing circuits CC$_0$, CC$_1$ . . . CC$_M$. A generic circuit CC$_k$ (k=0, 1, 2 . . . M) updates a respective weighting coefficient C$_k$ by implementing during the first operating phase of device AM the relationship:

$$C_k^{n+1} = C_k^n + \beta_n \cdot e_n \cdot r_{n-k} \tag{1}$$

with $$\beta_n = \frac{2\alpha}{\sum_{i=1}^{M} r_{n-i}^2} \tag{2}$$

where C$_k^n$ is the value of coefficient C$_k$ at instant nT (the time when the n$^{th}$ digital sample r$_n$ appears on lead 1); r$_{n-i}$, r$_{n-k}$ are the samples carried by lead 1 at instants (n−i)T, (n−k)T; and e$_n$ represents an error signal emitted by subtractor ST$_1$ on lead 4 (see FIG. 1), this error signal being the difference between a sample of an output signal generated by coder CD on lead 2 and a corresponding sample of a corrected signal produced by filter FA on lead 3. Each coefficient C$_k$ attains its final value upon error signal e$_n$ closely approaching a constant value of zero.

Accumulator-squarer AS, divider AD and selector SL$_3$ coact to calculate the factor β$_n$ in equation (1). Convergence constant α is a real number between 0 and 1. Generally, the smaller the value of constant α, the longer the convergence time and the more accurate the final values of coefficients C$_k$. Constant α is chosen from a predetermined multiplicity of magnitudes of selector SL$_3$, multiplied by two and transmitted to divider AD. This divider also receives from unit AS via lead 23 a digital signal coding the sum of the squares of the signal samples r$_n$ carried by lead 1 from the beginning of the first testing phase. Unit AS squares each sample as it arrives, adding the result to the sum of the squares of the preceding samples. Upon the appearance of the M$^{th}$ sample, counter CN emits a blocking signal to unit AS for preventing same from accepting any further test-signal samples.

Divider AD forms the parameter β as the quotient of the doubled value of constant α and the sum arriving over lead 23 and transmits this quotient in digitally encoded form over lead 24 to multipliers MP$_1$ of circuits CC$_0$, CC$_1$-CC$_M$; these multipliers form the product of quotient β$_n$ times the error signal e$_n$ arriving from subtractor ST$_1$ at time nT and forward that product to components MP$_2$ for multiplicative combination with digital samples r$_n$, r$_{n-1}$ . . . r$_{n-M}$, respectively. The adder S$_2$ of each circuit CC$_0$, CC$_1$ . . . CC$_M$ algebraically combines the output product of the associated multiplier MP$_2$ with a previously calculated weighting coefficient C$_0^n$, C$_1^n$ . . . C$_M^n$ temporarily stored by delay line DL, thereby computing an updated coefficient C$_0^{n+1}$, C$_1^{n+1}$ . . . C$_M^{n+1}$. These updated coefficients C$_k^{n+1}$ are transmitted from the respective processing circuits CC$_k$ to multipliers ML$_k$ for multiplicative combination with digital samples r$_{n+1-k}$ arriving from generator GS and delay lines RT$_k$ (k=0). The corrected or compensated signal a$_n$ emitted by adder S$_1$ on lead 3 at instant nT is a linear combination of the currently arriving sample r$_n$ and M previously received samples r$_{n-1}$, r$_{n-2}$ . . . r$_{n-M}$:

$$a_n = C_0^n \cdot r_n + C_1^n \cdot r_{n-1} + C_2^n \cdot r_{n-2} + \ldots + C_M^n \cdot r_{n-M} \tag{3}$$

During the first testing phase, filter coefficients are periodically modified in response to error signal e$_n$ in order to identify and subsequently reproduce the linear characteristics of coder CD. At the start of this first phase, quality analyzer MQ may be disabled or deactivated by a signal from selector $SL_1$. Upon the termination of the first testing phase, i.e. with attainment of a substantially uniform near-zero level by error signal $e_n$, selector $SL_1$ may be operated to send an energization signal to analyzer MQ.

FIG. 1 shows analyzer MQ as comprising three networks $MQ_1$, $MQ_2$ and $MQ_3$ which effectuate different quality measurements by processing according to respective algorithms the signals arriving over leads 3 and 4. Selector $SL_1$ may, under the control of an operator, transmit switching signals to analyzer MQ for enabling the connection of one of these networks to input leads 3, 4 and to display unit DP.

Figure 3:
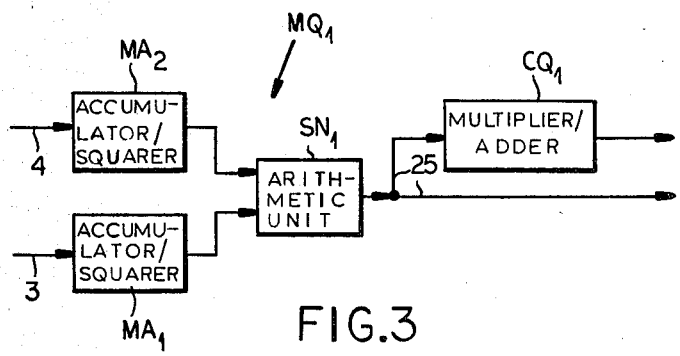
FIG. 3 is a block diagram of a component of the analyzer of FIG. 1.

As illustrated in FIG. 3, network $MQ_1$ includes a pair of accumulator-squarers $MA_1$, $MA_2$ with inputs connected to leads 3, 4, respectively, and with outputs terminating at an arithmetic unit $SN_1$ which has an output lead 25 extending to a multiplier-adder-combination unit $CQ_1$. Network $MQ_1$ computes a total signal-to-noise ratio SNR according to the algorithm:

$$SNR = 10 \cdot \log \frac{\sum_{j=1}^{N} s_j^2}{\sum_{j=1}^{N} v_j^2} \qquad (4)$$

where $s_j$ is the $j^{th}$ digital sample in a corrected or compensated signal emitted by filter FA during the second operating phase of quality-measuring device AM in response to a second test signal from source GS, $v_j$ is the corresponding digital sample in an output sequence generated by coder CD in response to the second test signal, and N is the total number of samples in the second test signal (and thus in the sequences emitted by filter FA and coder CD).

Upon the termination of the first testing phase and the connection of network $MQ_1$ to display DP (FIG. 1), each reference sample $s_j$ arriving over lead 3 is squared by unit $MA_1$ and added to the sum of squares of previously received reference samples. Similarly, each noise sample arriving over lead 4 is squared and algebraically combined with the sum of the squares of noise samples transmitted to accumulator-squarer $MA_2$ during the second testing phase. The sums accumulated by units $MA_1$, $MA_2$ are transferred to unit $SN_1$ which calculates the total or cumulative signal-to-noise ratio SNR is decibels, this ratio being transmitted over lead 25 to multiplier-adder $CQ_1$. The latter unit transforms ratio SNR into a quality indication $IQ_1$ in the form of an integer ranging from 1 through 9 (the higher the number, the better the quality of coder CD) by multiplying ratio SNR with a first evaluation constant b and then adding a second evaluation constant c:

$$IQ_1 = b \cdot SNR + c \qquad (5)$$

Unit $CQ_1$ may also include circuitry for rounding IQ to the nearest integer prior to transmission to display DP (FIG. 1).

Although the test signal used in the second operating phase (computing quality indication IQ) could be the same as the signal —e.g. that from shift register $SR_1$—used in the first operating phase (identifying linear characteristics of coder CD), we prefer to connect, for example, generator $ROM_2$, $ROM_3$, MU (FIG. 6) of artificial speech signals to coder CD and filter FA during the second phase. Depending on the rate of variation of the envelope signal stored in memory $ROM_3$, the second test phase can last from a fraction of a second to a few seconds. Generally, the greater the variation rate, the longer the measuring interval and the more accurate the resulting quality indication IQ.

Figure 4:
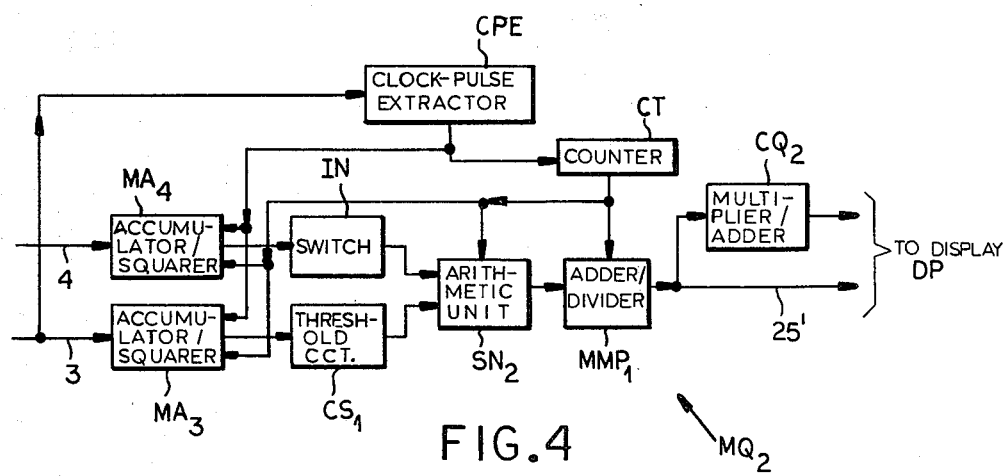
FIG. 4 is a block diagram of another component of the analyzer of FIG. 1.

As illustrated in FIG. 4, network $MQ_2$ includes an accumulator-squarer $MA_3$ tied at an input to lead 3 and at an output to a threshold circuit $CS_1$. This circuit is in turn connected to the control input of an interrupter switch IN and to an arithmetic unit $SN_2$ similar in operation and design to unit $SN_1$ (FIG. 3). Another accumulator-squarer $MA_4$ is linked at a signal-receiving side to lead 4 and at a transmitting side to arithmetic unit $SN_2$ via switch IN. Unit $SN_2$ feeds an adder-divider $MMP_1$ which has an output lead 25' extending to a multiplier-adder $CQ_2$ identical with unit $CQ_1$ (FIG. 3) in structure and function.

Let us assume that the corrected digital signal arriving over lead 3 from filter FA has an intersample period T. A clock-pulse extractor CPE connected to lead 3 emits a train of enabling pulses with a cadence 1/T to units $MA_3$, $MA_4$ and to a counter CT. Upon receiving J pulses from extractor CPE, counter CT transmits a resetting signal to accumulator-squarers $MA_3$, $MA_4$ and a control signal to units $SN_2$ and $MMP_1$ for inducing same to commence computing operations. Counter CT has a modulus of J counting steps or, alternatively, a feedback loop for resetting itself after every J steps.

Network $MQ_2$ computes a simple average or segmental signal-to-noise ratio SNRS according to the equation:

$$SNRS = \frac{1}{P} \cdot \sum_{p=0}^{P-1} 10 \log \frac{\sum_{j=1}^{J} s^2(j+pJ)}{\sum_{j=1}^{J} v^2(j+pJ)} \qquad (6)$$

where P is the number of test intervals or segments into which the second operating phase is divided, J is the number of samples in each segment, $s^2(j+pJ)$ is the square of the $j^{th}$ reference sample in the $p^{th}$ segment ($j=1,2 \ldots J$; $P=0, 1, 2 \ldots P-1$), and $v^2(j+pJ)$ is the square of the $j^{th}$ noise sample in the $p^{th}$ segment. Upon the connection of network $MQ_2$ to leads 3, 4 and to display DP at the beginning of the second testing phase, units $MA_3$ and $MA_4$ commence the algebraic squaring of incoming reference and noise samples and the adding of the results to sums of squares of previously received reference and noise samples. The squaring and adding operations are controlled by clock-pulse extractor CPE. At the end of each test interval or segment, counter CT emits a pulse to the accumulator-squarers $MA_3$, $MA_4$, causing the same to transmit their contents to threshold circuit $CS_1$ and switch IN, respectively. If the sum computed by unit $MA_3$ exceeds a predetermined limit (e.g. 54 dBm), circuit $CS_1$ transfers the sum to arithmetic unit $SN_2$ and sends a signal to switch IN, closing same, whereby the sum computed by unit $MA_4$ is fed to unit $SN_2$. This unit calculates a signal-to-noise ratio in decibels from the sums accumulated by units $MA_3$ and $MA_4$ and forwards the result to accumulator-divider $MMP_1$ where it is added to a sum of segmental signal-to-noise ratios calculated in preceding intervals in a current second operating phase.

Upon the termination of the $P^{th}$ testing interval, i.e. at the end of the second testing phase, counter CT emits to unit $MMP_1$ a signal inducing the same to divide by P the accumulated sum of segmental signal-to-noise ratios and to transmit the resulting average ratio to unit $CQ_2$. This unit computes quality indications $IQ_2$ as follows:

$$IQ_2 = d \cdot SNRS + f \qquad (7)$$

where parameters d and f are real numbers, e.g. 0.31 and 0.89, respectively. Indication $IQ_2$ will generally be a number from 1 through 9 and may be rounded by unit $CQ_2$ to the nearest integer before transmission to display DP.

Figure 5:
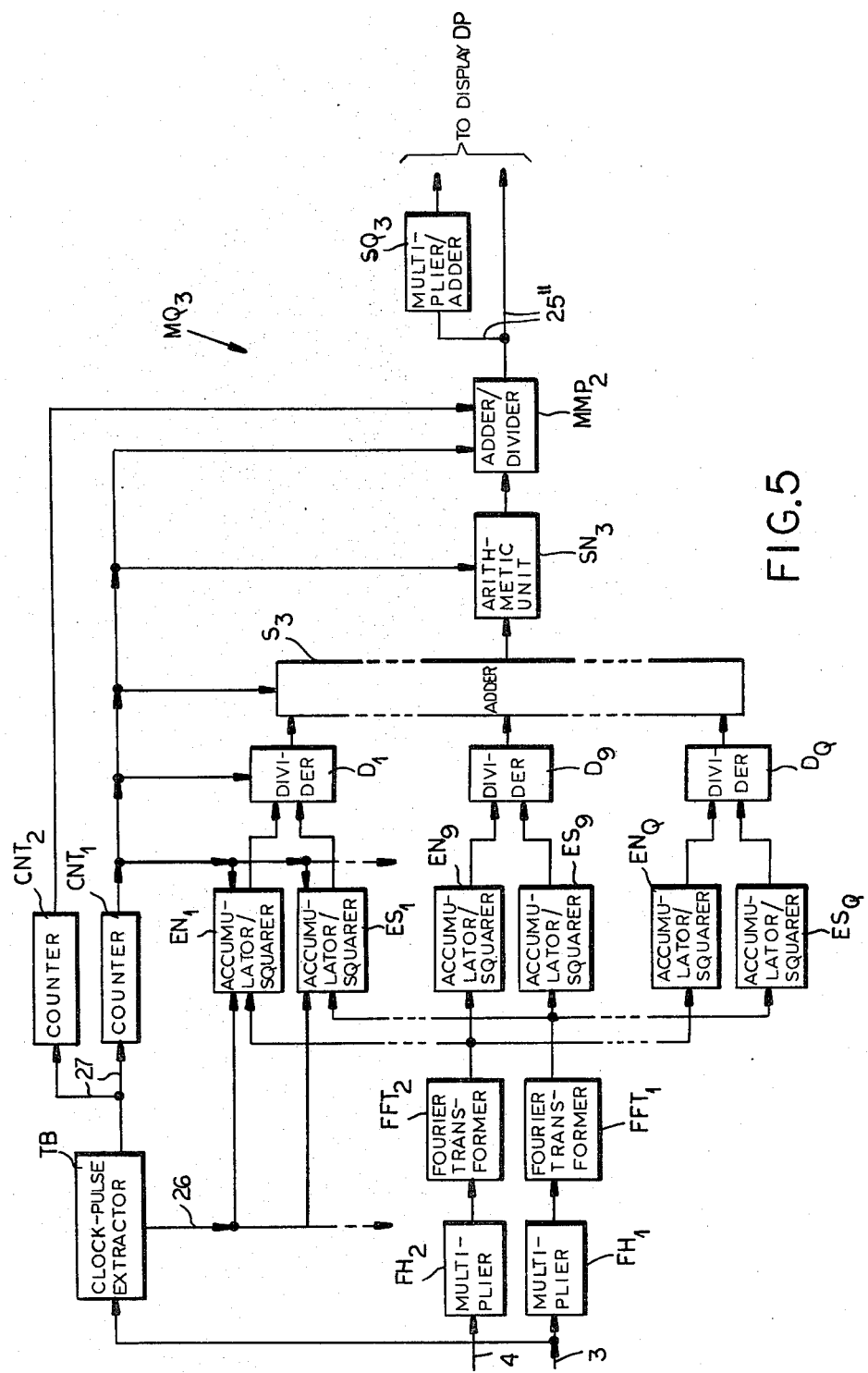
FIG. 5 is a block diagram of a further component of the analyzer of FIG. 1.

As illustrated in FIG. 5, network $MQ_3$ comprises a pair of structurally identical circuits $FH_1$, $FH_2$ connected to leads 3 and 4 for multiplying, during each test interval into which the second operating phase is divided, the reference signal (lead 3) and the noise signal (lead 4) the so-called "Hamming window", thereby forming sample frames with a length suitable for the computation of fast Fourier transforms, e.g. frames of 128 samples. The division into frames is accomplished without negatively affecting the transform computation. Units $FH_1$, $FH_2$ transmit the sample frames to respective devices $FFT_1$, $FFT_2$ which compute the fast Fourier transform of the incoming samples to generate outgoing samples in the frequency domain. Device $FFT_1$ has no output connected in parallel to a multiplicity of accumulator-squarers $ES_1 \ldots ES_q \ldots ES_Q$, where Q is the number of sub-bands into which the band of the transmitted signal is divided, while device $FFT_2$ has an output connected in parallel to as many accumulator-squarers $EN_1 \ldots EN_q \ldots EN_Q$. Units $ES_1$-$ES_Q$ and $EN_1$-$EN_Q$ compute the power associated with the reference samples and the noise samples, respectively, by summing the squares of the moduli of the numbers representing the samples.

Each pair of accumulator-squarers $ES_q$, $EN_q$ (q=1, 2 ... Q) associated with the same sub-band works into a divider $D_q$ which is in turn connected to an adder $S_3$. This adder feeds, via an arithmetic unit $SN_3$, an accumulator-divider $MMP_2$ which has an output lead 25" extending to a multiplier-adder $CQ_3$ identical in structure and function with units $CQ_1$, $CQ_2$.

Network $MQ_3$ computes a frequency-weighted segmental signal-to-noise ratio SNRF according to the equation:

$$SNRF = \frac{1}{P} \sum_{p=1}^{P} 10 \cdot \log \frac{1}{1 + \sum_{q=1}^{Q} \frac{V_q(p)}{S_q(p)}} \qquad (8)$$

where $V_q(p)$ is the noise-signal power of the $q^{th}$ frequency band in the $p^{th}$ testing interval or segment and $S_q(p)$ is the reference-signal power of the $q^{th}$ frequency sub-band in the $p^{th}$ testing interval.

As illustrated in FIG. 5, analyzer network $MQ_3$ further includes a clock-pulse extractor TB connected at an input to lead 3 and having a first output lead 26 extending to accumulator-squarers $ES_1$-$ES_Q$ and $EN_1$-$EN_Q$ for enabling the periodic operating thereof. Extractor TB has a second output lead 27 feeding stepping pulses to a pair of counters $CNT_1$ and $CNT_2$. Counter $CNT_1$ has a modulus equal to the number J (e.g. 128) of digital samples in each testing interval, while counter $CNT_2$ has a modulus equal to the total number P·J of samples in the second operating phase. At the end of each interval or segment, counter $CNT_1$ emits a resetting signal to accumulator-squarers $ES_1$-$ES_Q$ and $EN_1$-$EN_Q$ and an enabling signal to dividers $D_1$-$D_Q$, adder $S_3$, arithmetic unit $SN_e$ and adder-divider $MMP_2$ for inducing the formation of quotients $V_q(p)/S_q(p)$ by dividers $D_q$, the calculation of sum $$1 + \sum_{q=1}^{Q} V_q(p)/S_q(p)$$

by adder $S_3$, the computation of the frequency-weighted signal-to-noise ratio (in decibels) by unit $SN_3$ and the addition of this ratio by unit $MMP_2$ to the sum of frequency-weighted segmental signal-to-noise ratios calculated in the preceding testing intervals of the current operating phase. Upon the termination of the second testing phase, i.e. after reception by counter $CNT_2$ of P·J pulses from extractor TB, this counter emits a signal to adder-divider $MMP_2$ causing same to divide the accumulated ratio sum by segment total P and to emit the resulting average ratio SNRF to unit $CQ_3$. A quality indication $IQ_3$ is calculated by this unit according to the relation:

$$IQ_3 = g \cdot SNRF + h \qquad (9)$$

where parameters q and h are real numbers and where quality indication $IQ_3$ may be rounded by unit $CQ_3$ to an integer from 1 through 9.

Possible values for parameters b, d, g and c, f, h are reported in the paper "Perceptual and Objective Evaluation of Speech Processed by Adaptive Differential PCM" by B. McDermott, C. Scagliola and D. Goodman (The Bell System Technical Journal, Vol. 57, No. 5) and in the paper "Evaluation of Adaptive Speech Coders Under Noisy Channel Conditions" by C. Scagliola (The Bell System Technical Journal, Vol 58, No. 6).

Figure 7:
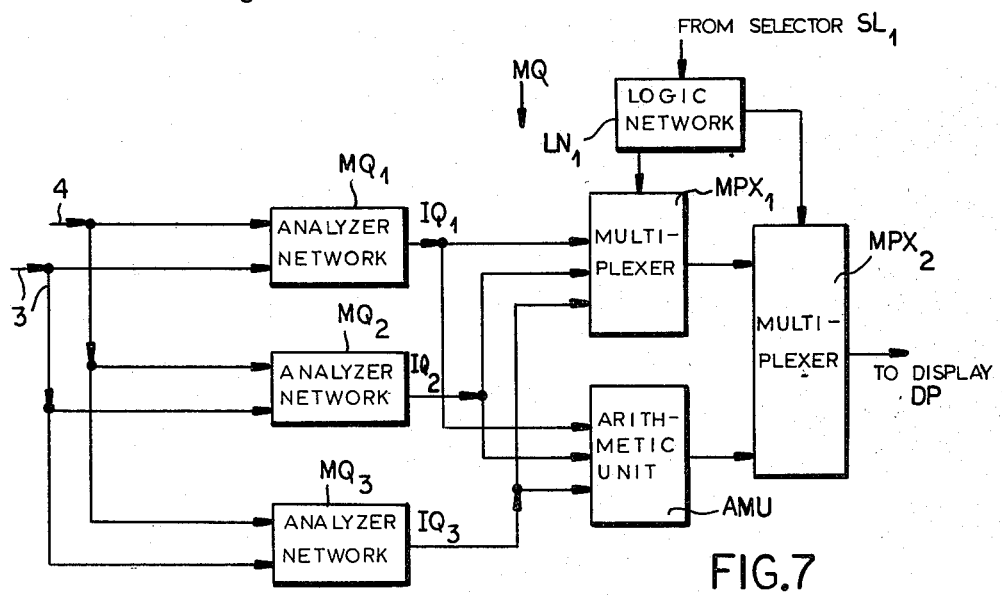
FIG. 7 shows the components of FIGS. 3, 4 and 5 together with additional circuitry of the analyzer of FIG. 1.

As illustrated in FIG. 7, analyzer MQ may include, in addition to networks $MQ_1$-$MQ_3$, a first multiplexer $MPX_1$ inserted between these networks and a second multiplexer $MPX_2$, both multiplexers being controlled by a logic network $LN_1$ in response to signals from selector $SL_1$ (FIG. 1) for commanding the readout of a quality indication $IQ_1$, $IQ_2$ or $IQ_3$ to multiplexer $MPX_2$. An arithmetic unit AMU is connected to analyzer networks $MQ_1$-$MQ_3$ for linearly combining their respective indications $IQ_1$-$IQ_3$ to produce a total indication $IQ_T$. In response to a signal from logic network $LN_1$, multiplexer $MPX_2$ transmits to display DP either a single indication $IQ_1$, $IQ_2$ or $IQ_3$ or the linear combination $IQ_T$.

It is to be noted that the functions of networks $MQ_1$-$MQ_3$ may be performed by a microprocessor or other programmable unit with a memory for storing instructions for the selective implementation of equations (1)-(9) in response to signals received from selector $SL_1$.

For speech coders having high bit rates, e.g. rates higher than 16 kbit/sec, and signal-to-noise ratios between 30 and 40 dB, constant $\alpha$ has an optimal value of approximately 0.01. Raising this value significantly increases measurement error if certain properties of a speech coder, particularly very low noise powers, are to be measured; lowering the value of the convergence constant, on the other hand, does little to improve testing accuracy. For coders with bit rates lower than 16 kbit/sec an optimal value of constant $\alpha$ is approximately 0.1. However, raising this value for low-bit-rate coders frequently increases error only to a negligible extent.

We claim:
1. A method of testing the quality of digital speech-transmission equipment, comprising the steps of:
   generating a first test signal consisting of a sequence of digital samples;
   transmitting said first test signal to said equipment and to an adaptive transversal filter;
   modifying samples of said first test signal in said filter by multiplication with weighting coefficients to produce a first corrected signal;
   generating a first error signal formed as a difference between said first corrected signal and a first output signal emitted by said equipment in response to said test signal;
   feeding said error signal back to said filter;
   updating said coefficients in said filter with the aid of said error signal;
   upon minimization of said error signal, storing the values of said coefficients last attained as a measure of the characteristics of the linear part of said equipment;
   generating a second test signal consisting of a sequence of digital samples;
   transmitting said second test signal to said equipment and to said filter;
   weighting the samples of said second test signal with the stored values of said coefficients to form a second corrected signal;
   generating a second error signal formed as a difference between said second corrected signal and a second output signal emitted by said equipment in response to said second test signal; and
   calculating an indication of the transmission quality of said equipment from said second error signal and said second corrected signal.

2. The method defined in claim 1 wherein said filter updates said coefficients according to the relation:

$$C_k^{n+1} = C_k^n + \frac{2\alpha}{\sum_{i=0}^{M} r_{n-i}^2} \cdot e_n \cdot r_{n-k}$$

where $C_k^n$ and $C_k^{n+1}$ are the values of the $k^{th}$ weighting coefficient at times $nT$ and $(n+1)T$, respectively, T being the period of the samples in said first test signal; $r_{n-i}$, $r_{n-k}$ are samples of the first test signal at instants $(n-i)T$ and $(n-k)T$; $\alpha$ is an adaptation constant having a value between 0 and 1 and affecting the convergence rate of coefficients $C_k$ ($k=1, 2, \ldots M$); and $e_n$ is the value of said first error signal at instant $nT$.

3. The method defined in claim 2 wherein the step of calculating an indication of the quality of said equipment includes computing at least one signal-to-noise ratio whose numerator is a function of said second corrected signal and whose denominator is a function of said second error signal.

4. The method defined in claim 3 wherein the computed signal-to-noise ratio is selected from a group comprising a total signal-to-noise ratio, a simple segmental signal-to-noise ratio and a frequency-weighted segmental signal-to-noise ratio.

5. The method defined in claim 4 wherein a plurality of parameters calculated from several signal-to-noise ratios of said group are linearly combined to form an indication of the quality of said system.

6. The method defined in claim 1, 2, 3, 4 or 5 wherein said first test signal and said second test signal are selected from a group consisting of sinusoidal signals, white-noise signals, frequency-shaped noise signals, actual speech signals and periodic artifical speech signals.

7. A device for testing the quality of digital speech-transmission equipment, comprising:
   a signal source connected to said equipment for feeding thereto during a first operating phase a first test signal inducing said equipment to emit a first output signal and for feeding to said equipment during a second operating phase a second test signal inducing said equipment to emit a second output signal, said test signals and said output signals comprising sequences of digital samples;
   signal-converting means including an adaptive transversal filter connected to said signal source in parallel with said equipment for producing a first corrected signal and a second corrected signal in response to said first test signal and said second test signal, respectively, said filter being provided with multiplication means for weighting samples in said test signals with coefficients periodically modified during said first operating phase to assume prior to said second operating phase fixed values identifying and codifying linear characteristics of said equipment;
   subtracting means connected to said equipment and to said filter for deducting from each sample to said first output signal a corresponding sample of said first corrected signal to produce a first error signal transmitted to said filter during said first operating phase for controlling modification of said coefficients; and
   calculating means connected to said subtracting means and to said filter for computing during said second operating phase an indication of the quality of said equipment from said second corrected signal and a second error signal formed by said subtracting means as a difference between samples of said second output signal and corresponding samples of said second corrected signal.

8. A device as defined in claim 7 wherein said signal source includes a generator of sinusoidal functions, a generator of white noise, a generator of frequency-shaped noise and a generator of periodic artificial signals having the spectral characteristics of average speech.

9. A device as defined in claim 8 wherein said generator of periodic artificial signals includes a unit producing a high-frequency periodic signal, another unit emitting a slowly varying envelope signal and arithmetic means for multiplying the high-frequency periodic signal and the envelope signal.

10. A device as defined in claim 7 wherein said calculating means includes a plurality of networks for generating quality measurements of said system according to respective computational algorithms.

11. A device as defined in claim 10 wherein said calculating means includes circuit means at the outputs of said networks for linearly combining the quality measurements generated by said networks.

12. A device as defined in claim 7 wherein said calculating means includes a programmable unit with a memory storing instructions for calculating a plurality of quality measurements on said system.

13. A device as defined in claim 7, 8, 9, 10, 11 or 12 wherein said calculating means includes circuitry for computing total signal-to-noise ratios, segmental signal-to-noise ratios and frequency-weighted signal-to-noise ratios.

* * * * *